United States Patent
Bianconi (12)

(10) Patent No.: US 6,265,019 B1
(45) Date of Patent: Jul. 24, 2001

(54) PROCESS OF INCREASING THE CRITICAL TEMPERATURE TC OF A BULK SUPERCONDUCTOR BY MAKING METAL HETEROSTRUCTURES AT THE ATOMIC LIMIT

(76) Inventor: Antonio Bianconi, Dipartimento di Fisica, Universita degli Studi di Roma "La Sapienza" P. Aldo Moro 2, I-00185, Rome (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/646,321
(22) PCT Filed: Nov. 17, 1994
(86) PCT No.: PCT/IT94/00196
§ 371 Date: Aug. 26, 1996
§ 102(e) Date: Aug. 26, 1996
(87) PCT Pub. No.: WO95/16281
PCT Pub. Date: Jun. 15, 1995

(30) Foreign Application Priority Data

Dec. 7, 1993 (IT) .............................. TO93A0929

(51) Int. Cl.[7] ..................................................... H01L 39/12
(52) U.S. Cl. ............................................. 427/62; 505/121
(58) Field of Search ................................... 505/121, 125, 505/470, 473; 427/62

(56) References Cited

FOREIGN PATENT DOCUMENTS 0 502 204 A1   9/1992 (EP) ............................. C01G/3/00

OTHER PUBLICATIONS

J.M. Triscone, et al., "Y–Ba–Cu–O/Dy–Ba–Cu–O Superlattices: A First Step towards the Artificial Construction of High–$T_c$ Superconductors," *Physical Review Letters*, vol. 63, No. 9, Aug. 28, 1989, pp. 1016–1019.

Qi Li, T. Venkatesan, et al., "Growth and superconducting properties of $Yba_2Cu_3O_7$–based superlattices," *Physica C*, 190, 1991, pp. 22–26.

M. Holcomb, et al., "New Phenomena in Proximity Effect Tunneling of High $T_c$ Superconducting Cuprates," *Physica C*, 185–189, 1991, pp. 1747–1748.

Robert F. Curl and Richard Smalley, "Fullerenes," *Scientific American*, vol. 265, No. 4, Oct. 1991, pp. 32–41.

*Primary Examiner*—Brian K. Talbot
(74) *Attorney, Agent, or Firm*—Flehr Hohbach Test Albritton & Herbert LLP

(57) ABSTRACT

A method of forming Supercondtuctors with high critical temperature is described in which heterostructures at the atomic limit are realized artificially by molecular beam epitaxy, sputtering, lithography, chemical synthesis, electrochemical deposition or other similar technologies, made by a plurality of first portions of a superconducting metallic material forming a lattice of substantially equal elements with constant period $\lambda_p$, at least in a first direction (y), and a plurality of second portions formed by a material with different electronic structure from that of the first portions, intercalated to the first portions to realize the separation between said first portions; the heterostructure is characterized by the fact that the plurality of first portions have a size (L) and a period ($\lambda_p$) as to satisfy the condition for the shape resonance condition for the electrons at the Fermi level and the plurality of second portions have a size (W) smaller or of the order of the superconducting Pippard coherence length $\xi_0$ of the superconducting material forming the first portions.

6 Claims, 3 Drawing Sheets

PROCESS OF INCREASING THE CRITICAL TEMPERATURE TC OF A BULK SUPERCONDUCTOR BY MAKING METAL HETEROSTRUCTURES AT THE ATOMIC LIMIT

TECHNICAL FIELD

The present invention relates to superconductors with a high critical temperature according to the first part of claims comprising an artificial heterostructure made by first portions of a superconducting material of a size L pushed toward the atomic limit. Moreover the invention relates to a method to realize these superconductors.

It is well known that a wide industrial application of superconductivity is limited by the fact that the superconducting metals available on the market exhibit very low critical temperatures (the critical temperature indicates the temperature for the onset of the superconductivity, i.e., for the zero resistivity and diamagnetism). These very low temperatures, of the order of few degree's Kelvin, can be reached by using low temperature technologies, that imply high cost and difficulties in the operation. Therefore the research in this field is addressed to realize new superconducting materials that will show higher critical temperatures.

BACKGROUND ART

A recent innovation in this field is the discovery of superconductivity in cuprate perovskites that show critical temperatures of the order of hundred degree's Kelvin. However this class of ceramic superconductors has a limited industrial application because these materials are fragile, they are difficult to shape and it is difficult to keep under control the oxygen content. These difficulties generate limits for the industrial applications of superconducting electronic devices using these ceramic materials.

Another difficulty for the advances in this field is due to the lack of a theory that explains the superconductivity at high temperature in these materials, therefore the progress in these materials advances by empirical approaches.

Superconducting cuprate perovskites have been described as natural superlattices of first superconducting $CuO_2$ layers with a two dimensional electronic structure, sandwiched by second blocking layers made of insulators, or metals with lower $T_c$, stacked in the c axis direction and similar artificial superlaltices have been synthesized (Physical Review Letters Vol 63, No. 9 August 1989, pages 1016–1019; J. -M. Triscone, M. G. Karkut, L. Antognazza, O. Brunner, Ø. Fisher: "Y-Ba-Cu-O/Dy-Ba-Cu-O Superlattices: A First Step towards the Artificial Construction of High $T_c$ Superconductors") and it has been also discussed in a recent patent application (Toray Industries, European Patent Appication EPA 0 502 204 A1, International application number PCT/JP91/01255, International publication number WO 92/0514 (02.04.92 92/08)); and in some papers (Physica C, Vol. 190, ISSN 0921-4534 Nos. 1/2 Decmber 1991, pages 22–26; Qi Li, T. Venkatesan and X. X. Xi: "Growth and superconducting properties of $YBa_2Cu_3O_7$-based superlattices"); (Physica C, Vol. 185–189, ISSN 0921-4534, Dec. 1, 1991, pages 1747–1748; M. Holcomb, J. P. Collman, and W. A. Little: "New phenomena in proximity effect tunneling of high $T_C$ superconducting cuprates"). Moreover also superconducting films of doped fullerene, such as $K_3C_{60}$, can be made for the production of intricately layered microelectronic devices (Scientific American (Int. Edition) October 1991, USA, vol. 265, no. 4, ISSN 0036-8733, pages 32–41 R. F. Curl and R. E. Smalley "Fullerenes").

DISCLOSURE OF INVENTION

The present invention as claimed is intended to overcome said difficulties by definition of the physical parameters for the design of new superconducting heterostructures with a critical temperature larger by several times than that of the bulk metallic superconducting materials.

In accordance with the present invention I provide a superconductor with high critical temperature formed by a plurality of first portions of a superconducting material, forming a lattice of substantially equal elements with constant period $\lambda_p$, at least in a first direction y, separated by a second material with different electronic structure; said plurality of second portions having a size W of the order of the superconducting Pippard coherence length $\xi_0$ of the superconducting material ($W \leq \xi_0$) forming said plurality of first portions; characterized in that said plurality of first portions have a size L, a period $\lambda_p$, measured in said first direction y, and a charge density to satisfy the "shape resonance" condition of the electrons at the Fermi level.

The present invention is based on the discovery that the superconductivity with high critical temperature is related to a particular heterogeneous structure of the superconducting material; said heterogeneous structure can be found in a cuprate perovskite. This heterogeneous structure determines an "amplification" of the critical temperature in comparison with that of the homogeneous superconducting material. Therefore by making artificial heterogeneous structures including any superconducting metal with a low critical temperature this is multiplied by an "amplification factor" related to the selected heterostructure, providing g a superconductor with an artificial ordered heterogeneous structure with a critical temperature several times, up to 100, larger than that of the homogeneous material.

The invention relates to a method to realize superconducting heterostructures with high critical temperature according with the principal claim characterized by the following phases:

to prepare a substrate made by a material that can be a metal, or a non metal.

formation on the substrate of a plurality of first portions of a superconducting material, which have at least in a direction y a selected dimension L and a selected spacing W.

formation on said first portions of second portions of a material with different electronic structure, that play the role of spacers. The spacing W should be of the order of the superconducting Pippard coherence length $\xi_0$ of the superconducting material ($W \leq \xi_0$) forming said plurality of first portions.

repetition of said phases of formation by a selected number of times up to realize a three-dimensional heterostructure; said dimensions L and spacing W are selected in order to realize for the electrons at the Fermi level in the superconducting metal a "shape resonance" condition. In particular said heterostructure can be realized by molecular beam epitaxy. A second method to realize superconductors with high critical temperature according with the principal claim, but more simple, relates to the formation of a three-dimensional heterostructure made by a plurality of films of a superconducting material, first portions, separated by a plurality of non superconducting films (or superconductors with a lower critical temperature), second portions; the thickness L of the superconducting films, and the thickness W of the non superconducting films are such to realize a "shape resonance" condition for the electrons at the Fermi level in the superlattice of superconducting films. In order to realize a "shape resonance" condition the thickness of the superconducting metal film will be of the order of the thickness of few atomic layers, therefore the film thickness should be controlled to be uniform at the atomic limit.

Other embodiments of the invention are shown in FIGS. 4 to 7. Several types of superconducting heterostructures at the atomic limit made by superlattices of quantum wells, quantum wires, and quantum dots, and quantum spheres respectively are presented therein.

Figure 8:
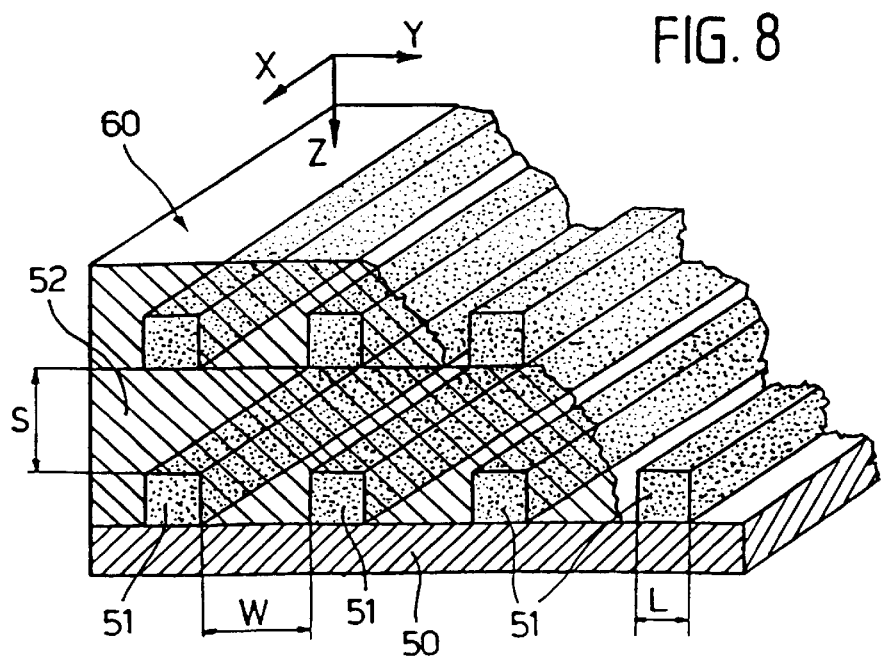

FIG. 8 shows as an example a method to create a superlattice of quantum wires.

BEST MODE FOR CARRYING OUT THE INVENTION

The present invention is based on the idea that it is possible to rise the critical temperature $T_{c\infty}$ of bulk homogeneous superconductors (metallic elements, alloys, metallic compounds, doped semiconductors or oxides) by shaping the superconducting material in the form of a plurality of units forming a superlattice where the size L of each unit is so small to show the effect of quantization of the electron wave vector in at least one dimension, i.e. superlattices of quantum wells, quantum wires, or quantum dots, where the Fermi level of the said superconducting superlattice is tuned close and above the bottom of a superlattice subband, that is called a "shape resonance" condition for the electrons at the Fermi level. At the "shape resonance" condition the Fermi level is tuned to a maximum of the electronic density of states artificially created by the confinement of the electrons in the superconducting units.

A similar idea (to increase the superconducting critical temperature by quantum confinement, i.e., by tuning the Fermi level at a "shape resonance" condition) in a single quantum well was proposed by Blatt and Thompson [J. M. Blatt and C. J. Thompson *Phys. Rev. Lett.* 10, 332 (1963); C. J. Thompson and J. M. Blatt, *Phys. Lett.* 5, 6 (1963)] but it was discarded and forgotten by the scientific community because quantum fluctuations in low dimension, $D \leq 2$, suppress the superconducting phase in a single quantum well or quantum wire.

Figure 1:
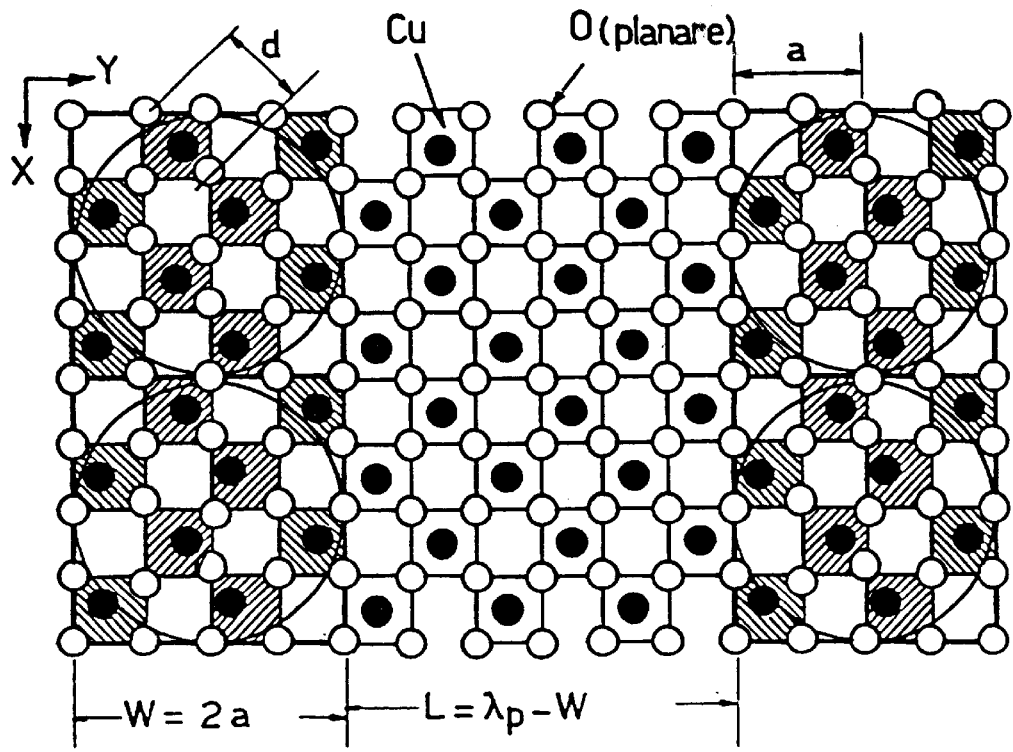
FIG. 1 shows the structure of the $CuO_2$ plane in $Bi_2Sr_2CaCu_2O_{-8}$ decorated by stripes of different Cu site conformations, distorted square pyramids, as determined by the author naturally occurring heterostructure as shown in FIG. 1 does not fall within the scope of the present claims thus serving for illustrating only.

The applicant has addressed his studies to show that it is possible to increase the critical temperature $T_c$ by realizing the "shape resonance" condition not in a single superconducting unit but in a "superlattice" of units, showing the quantization effect due to the reduced size, to overcome the problems listed above. He has used for experimental verification the ceramic superconductors of the family Bi2212 (perovskites of copper oxides of chemical formula $Bi_2Sr_2Ca_{1-x}Y_xCu_2O_{8+y}$). The fact that in these oxides the planes of Cu oxide were not homogeneous was known [A. Bianconi, et al. in "*Lattice Effects in High-$T_c$ Superconductors*" edited by Y. Bar-Yam et al., World Scientific Pub., Singapore, 1992, pag. 65; A. Bianconi, in "*Phase Separaton in Cuprate Superconductors*" edited by K. A. Müller & G. Benedek, World Scientific Pub., Singapore, 1992, pag. 125] in particular it was known that in this material there are domains where the distance between the Cu atom and the apical oxygen had different values. The applicant has demonstrated that the copper oxide plane in $Bi_2Sr_2CaCu_2O_{8+y}$ at a temperature lower than 120 K has the structure modulated as shown in FIG. 1, where there are a plurality of domains, i.e., stripes of width W, called barriers, formed by a lattice of distorted Cu site confirmations where the bond of Cu with the apical oxygen is short (<2.4 Å), with constant period $\lambda_p$ in the direction y, separated by stripes of width L, where the bond of Cu with the apical oxygen is long (>2.5 Å).

The width L of the stripes has been obtained by the measure of the ratio between the number of the long copper-apical oxygen bonds and the total number of copper-apical oxygen bonds by using the EXAFS method as described in [*X Ray Absorption: Principle, Applications Techniques of EXAFS, SEXAFS and XANES* edited by R. Prinz and D. Koningsberger, J. Wiley and Sons, New York 1988]; the period $\lambda_p$ in the y direction has been measured by electron diffraction; moreover the component of the wave vector of the electrons at the Fermi level in the y direction ($k_{Fy}$) has been measured by angular resolved photoemission [following Z. X. Shen *J. Phys. Chem. Solids* 53, 1583 (1992)].

The measures carried out on a single crystal grown by the "floating zone" method with $T_c$=84° K have provided the period of the modulation $\lambda_p$=4.7a (where a=5.4 Å is the lattice constant); the width L=2.7a; and the component of the wave vector of the electrons at the Fermi level $k_{Fy}$~0.38 (±0.03) $2\pi/a$. The width W of the stripes characterized by the Cu sites with the short Cu—apical oxygen bond has been found to be 2a in the temperature range lower than 120 K. The width W=10.8 Å of the barriers is of the order of the superconducting Pippard coherence length $\xi_0$ of the superconducting material.

The investigations carried out on different superconductors with different doping level, with different Y content have shown that the superstructure period changes and L changes with doping by keeping the Fermi level at the "shape resonance condition"; the width W has been assumed to be doping independent because it is associated with a lattice instability at the critical doping of one hole per 8 Cu sites $\delta_c$=1/8 [W. E. Pickett et al. *Phys. Rev. Lett.* 62, 2751 (1989)].

Figure 2:
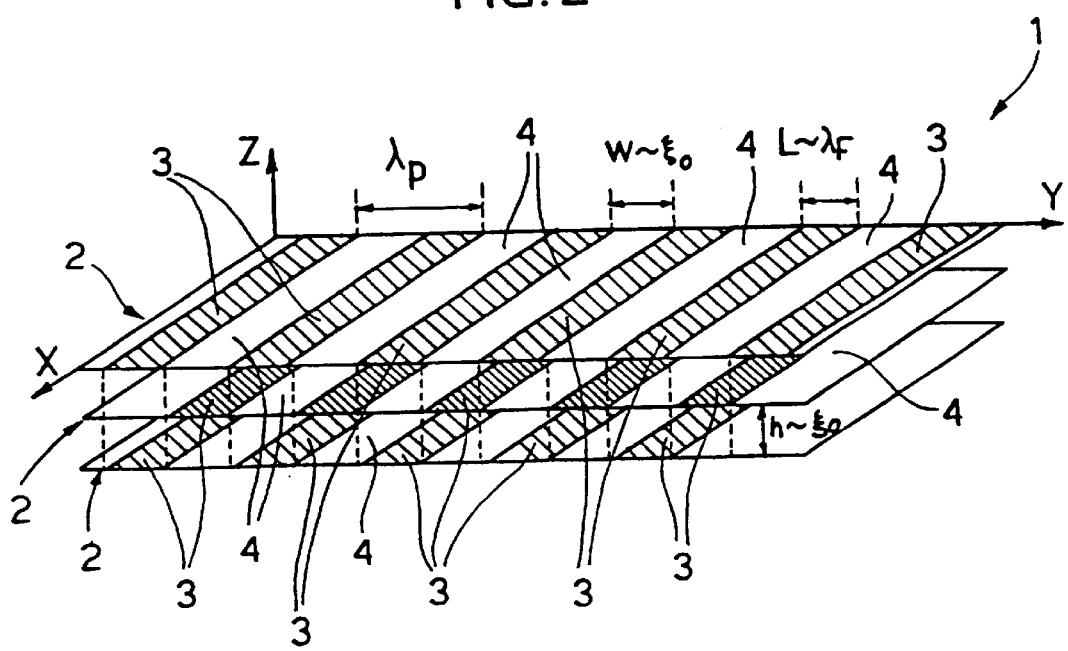
FIG. 2 shows as a first embodiment of the present invention the structure of the superconducting heterostructure at the atomic limit, formed by a superlattice of quantum stripes realized in $Bi_2Sr_2CaCu_2O_{-8}$ which according with the present invention gives an amplification of the critical superconducting temperature by about a factor 10.

Therefore the electrons at the Fermi level in the stripes of width L are at the "shape resonance" condition, where they are trapped in the stripes of size L, defined by the barriers of size W, realign a superlattice with period $\lambda_p$ [see FIG. 2] and the Fermi level is used above the bottom of the m=2 subband with the wave vector $k_{Fy}$~$2\pi/L$.

Figure 3:
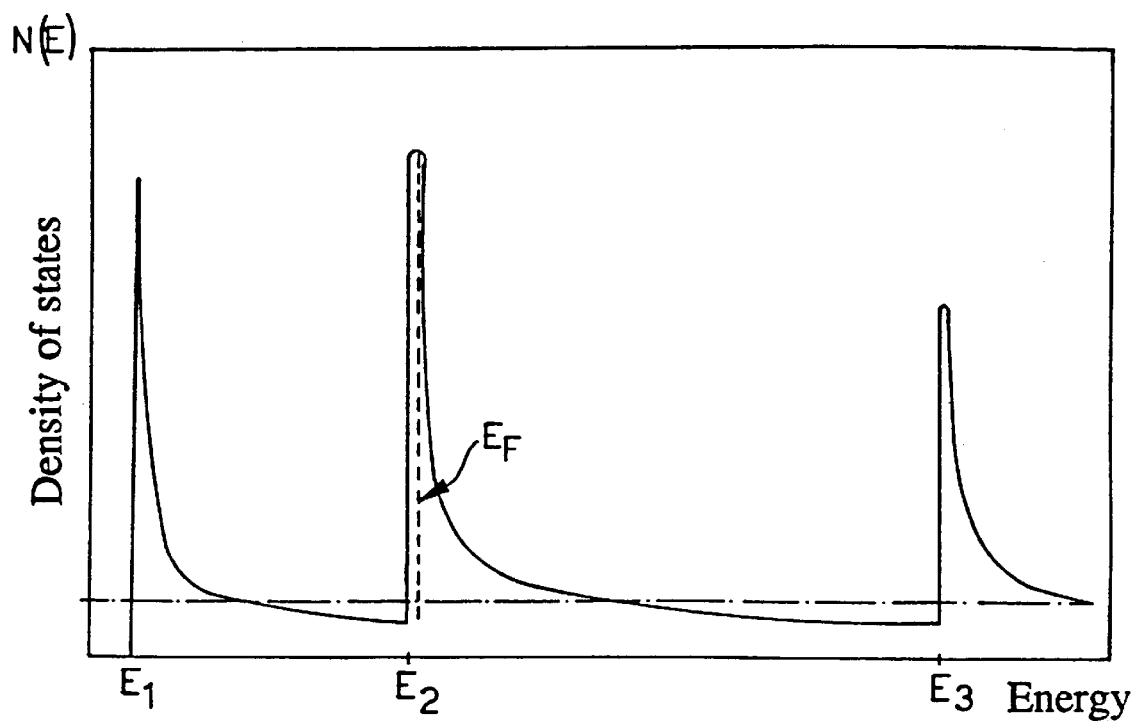
FIG. 3 shows the qualitative behavior of the density of states of the superlattice of quantum stripes in the $CuO_2$ plane. The Fermi energy is tuned near a maximum in the density of states to increase the critical temperature.

The "shape resonance" condition can be defined in a more general way with reference to FIG. 3 where the dashed line indicates the curve of the electronic density of states versus the electron energy for a two dimensional homogeneous conducting plane and the solid line is the "Density of states" versus "Energy" curve modified for the heterostructure shown in FIGS. 1 and 2; therefore the density of states is modified in comparison with the homogeneous material by the confinement of the electrons in the superlattice of one-inventional stripes and it shows new maxima at the energies $E_m$ (where m is the number of the resonance); for the "shape resonance" condition we intend the quantum state where the Fermi level is tuned in the range of a maximum of the density of states/energy curve near the bottom of a subband $E_m$ generated by the heterostructure in a superconducting metal, as in FIG. 3.

Following the standard theory for superconductivity (BCS theory) the critical temperature $T_{c\infty}$ for the transition from the normal metallic phase to the superconducting phase in a infinite homogeneous material is $$T_{c\infty} \sim \omega_D \exp(-1/N_0 V) \tag{1}$$

for the $CuO_2$ superconducting plane the Debey temperature is known to be about 500 K, and the product $N_0V$ is known to be about 0.2, where $N_0$ is the density of states at the Fermi level and V the electron-phonon coupling constant; therefore the critical temperature $T_{c\infty}$ for a homogeneous $CuO_2$ plane has been estimated to be in the range of 4–15 K.

For the heterogeneous $CuO_2$ plane shown in FIG. 1, where the Fermi level is tuned to the m=2 maximum of the density of states of the m=2 subband of the superlattice of quantum stripes, the density of states $N_0$ at the Fermi energy is enhanced and the critical temperature is enhanced. Following the approach of Thompson and Blatt [C. J. Thompson and J. M. Blatt, *Phys. Lett.* 5, 6 (1963)] the critical temperature for a superlattice of quantum stripes can be written as $$T_c \sim \omega_D \exp(-1/N_0 V)\exp\{+k/(N_0 V)\} \tag{2}$$

where $\exp\{+k/(N_0V)\}$ is an "amplification factor" $A=T_c/T_{c\infty}$ determined by the quantum confinement; k is related with the effective increase of the density of states at the Fermi level by the quantum confinement in the heterostructure relative to the homogeneous material and by the shape resonance number m. For the superlattice of quantum stripes with the Fermi level tuned above the bottom of the m=2 subband, as it has been found in Bi2212, the amplification factor A of the order of 5 has been obtained. The critical temperature is enhanced in the superlattice to the high temperature range of 35–85 K from the normal expected value of 4–15 K for the homogeneous $CuO_2$ plane.

From what it has been described above the applicant has deduced that the superconductivity with high critical temperatures can be obtained in normal superconducting metals, as for example the largely used niobium compounds, if the physical structure of the superconductor is designed to follow the particular conditions which are verified for the copper oxide plane in Bi2212, the structure of the new metallic superconducting materials with high $T_c$ should reproduce the conditions of this ordered non homogeneous phase which has been determined to be present in Bi2212.

In accordance with the present invention a superconductor with high critical temperature shows a structure as in FIG. 2 where I give a pictorial view of the superconductor 1 shown at the level of atomic planes formed by a metal heterostructure made by a plurality of first portions 3 of any superconducting material, forming a lattice of substantially equal elements with constant period $\lambda p$, at least in least in one direction (in this case the direction y) and a plurality of second portions 4, formed not by the same material as the plurality of first portions 3, disposed to separate the portions 3; in order to activate in this heterostructure the process of the amplification of the critical temperature characteristic of the material forming the portions 3 in the homogeneous phase it is necessary that the described heterostructure realizes a superlattice of quantum units as described for the copper oxide plane in FIG. 1. This is obtained, following the present invention, by making the portions 3 with a size L, measured in the direction y, such that it realizes the conditions of the shape resonance for the electrons at the Fermi level, with wave length $\lambda_F$, this condition in the described heterostructure means that the size L should satisfy the simplified formula:

$$L \sim \frac{m\lambda_F}{2} \tag{3}$$

Moreover from the comparison between the theory of the superconductivity state in a superlattice and the heterostructure found in Bi2212 we deduce that a second condition to realize the invention is that the portions 4 should have a size W of the order of the Pippard coherence length $\xi_0$ of the superconducting material forming the portions 3 in order to stabilize the superconducting quantum state. For "size of the order of" we intend to say, here and in the following, that the value of W should be $\xi_0/x$ where x should be in the range of 0.1 to 100 in order to have a Josephson coupling between the superconducting portions. In the case of Bi2212, we have x~1, but for systems with larger $\xi_0$ it is possible to use x>1 and to decrease W, but in any case W should be large enough to reduce the probability for single particle hopping between the superconducting portions and to reduce the dispersion of the superlattice subbands.

By going in the detail of the realization of the heterostructure shown in FIG. 2 the superconductor with high critical temperature is formed by a plurality of parallel atomic planes 2 and each plane 2 includes a plurality of stripes 3 formed by the superconducting metallic material (including in this definition also the doped oxides or semiconductors) that have, according with (3), the width L equal to an integer number of half of the wave length of the electrons at the Fermi level in the stripes 3. Moreover the planes 2 include a plurality of second stripes 4, alternated to the stripes 3 and formed by a material with an electronic structure different from that forming the first stripes, that can be a metal with lower critical temperature; or a non metal, or vacuum (a non metal indicates any material also an organic compound). The stripes 4 have, according with the requirements listed above, a width W of the order of the Pippard coherence length $\xi_0$ of the superconducting an material forming the stripes 3; moreover in order to stabilize the three-dimensional superconducting phase it is necessary to have also in the z direction neighboring parallel superconducting planes decorated by the superlattice of quantum stripes at a distance h of the order of the Pippard coherence length $\xi_0$.

For the superconductor 1, with the structure shown in FIG. 2, it is possible to apply the formula (2), therefore it is possible to predict the enhanced critical temperature once the superconducting material forming the stripes 3 is known; in other words it is possible "a priori" to realize a superconductor with the desired critical temperature, by selecting the superconducting material forming the stripes 3 and the size of the components of the superlattice forming the heterostructure shown in FIG. 2 in order to tune the Fermi level at the desired order of the shape resonance. The larger amplification is obtained for the smaller size of the superconducting stripes tuning the Fermi level to the lower orders m of the shape resonances. Moreover the amplification factor in the heterostructure in formula (2) quenches the effect of the term $\exp(-1/N_0V)$ on the formula (1) which reduces the critical temperature, therefore the amplification factor will be more effective in the heterostructures formed by the superconducting material with a larger $\omega_D$.

Figure 4:
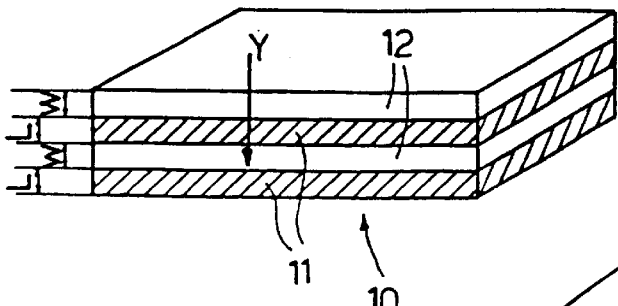

With reference to the drawing in FIG. 4, a superconductor with high critical temperature 10 is shown, which have a structe different from that of shown in FIG. 2, but it is designed in accordance with the parameters of the invention; in particular it is formed by a plurality of first superconducting layers 11 alternated with second layers 12 formed not by the same material as the first layers; the layers 11 have a selected thickness L, and the layers 12 have a selected thickness W in order to tune the Fermi level to the shape resonance condition of the superlattice and $W \leq \xi_0$.

Figure 5:
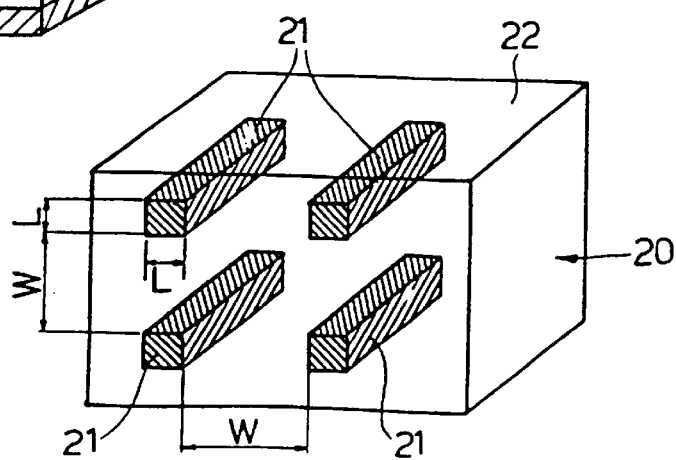

With reference to the drawing in FIG. 5, a third example of a superconductor 20 with high critical temperature realized according with the present invention is shown; the superconductor 20 is formed by a plurality of wires 21, formed by a superconducting material, parallel to each other forming a three-dimensional lattice; they are embedded in a matrix 22 formed not by the same material as the wires 21. The section of wires, a square or a circle, has a selected size L in order to satisfy the selected shape resonance condition and they are separated in the matrix 22 by the spacing W.

In general in order to determine the size L which should satisfy the "shape resonance condition" in the superlattice a formula can be used in the limit of negligible single particle hopping between the stripes, layers or wires:

$$k_F \sim (2\pi/L)(m/2) \quad (4)$$

where $k_F$ is the wave vector of the electrons at the level of the superconducting material. More in general the condition for the "shape resonance" shown in FIG. 3 can be written as $$E_F \sim E_m \quad (5)$$

which means that the Fermi energy is tuned near an artificial maximum of the electronic density of the states and it takes into account of the possible shift of the condition (4) due to dispersion of the superlattice subband for a non negligible hopping between the superconducting units.

Moreover in the case that the values of L obtained by using the formula (4) are so small that is difficult to realize the superconducting portions it is possible to use for the "shape resonance" condition:

$$|k_F - G| \sim (2\pi/L)(m/2) \quad (6)$$

where G is the vector of the reciprocal lattice of the superconducting material, $k_F$ is wave vector of the electrons at the Fermi level and m is an integer number.

Figure 6:
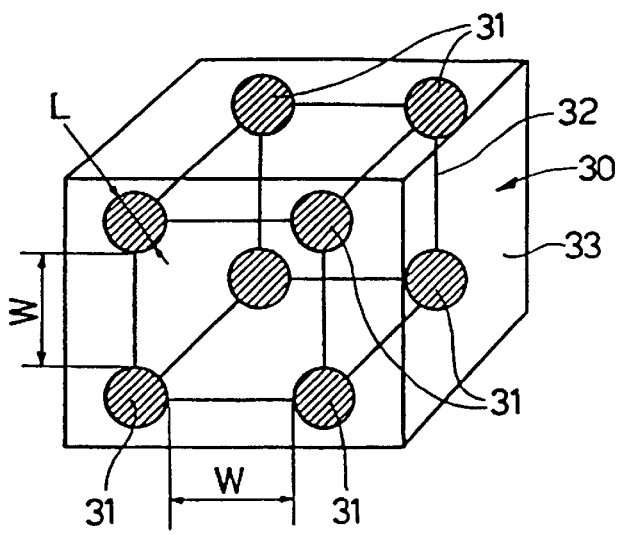

FIG. 6 shows another example of a superconductor 30 with high critical temperature realized according with the present invention; the superconductor 30 is formed by a plurality of spherical nuclei 31 formed by a superconducting material forming a three-dimensional lattice 32; they are embedded in a matrix 33 formed not by the same material as the superconducting nuclei 31. The size of the nuclei is L and they are separated by W.

Figure 7:
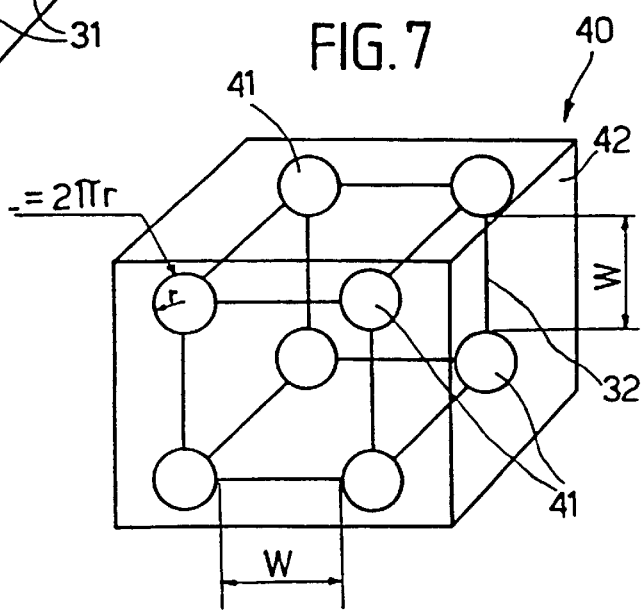

Finally FIG. 7 shows a superconductor 40 with high critical temperature realized according with the present invention similar to 30, but the superconducting material is formed by a plurality of empty spheres 41 of size L forming a three-dimensional lattice embedded in a matrix 42 formed not by the same material as the superconducting spheres 41 that provides the separation W between the spheres.

Another choice to realize the superconducting heterostructure with the high critical temperature according with the present invention is to copy the structure of the superconducting planes in Bi2212 (FIG. 1) forming a superlattice as in FIG. 2 where the material that forms the second portions 4 is different from the material forming the first portions only at the level of the crystal lattice.

In conclusion, the superconductor with high critical temperature according with the present invention should have one of the structures described above, where L should satisfy the "shape resonance" condition according with one of the given formulas (4), (5) and (6) and where W is smaller or of the order of the superconducting Pippard coherence length $\xi_0$.

The superconducting materials described in FIGS. 2, 4, 5, 6 and 7 can be realized by chemical reactions, and/or doping complex materials as in the case of cuprates, or they can be realized "artificially" by making the heterostructure following the present invention as it is described below for a superlattice of quantum wires (FIG. 8); first a flat surface at the atomic level of a substrate 50, made by a metal, or a non metal is prepared; in the following phase a plurality of superconducting units 51 made by a superconducting material different from the substrate; the units 51 are obtained by molecular beam epitaxy or by other equivalent techniques (as for example sputtering, lithography, chemical synthesis, electrochemical deposition). The units 51 are disposed to realize a lattice of identical units of size L forming a superlattice in at least one direction y separated by the selected spacing W in such a way to satisfy the described condition for the "shape resonance" in the superlattice; a good lattice mach of the crystalline surfaces of the different components is required in order to reduce the stress at the interface; in the next step a material 52 is disposed to cover the substrate 50 and the superconducting units 51; the last two phases are repeated a fixed number of times in order to make a three-dimensional metallic heterostructure 60.

In the case of the superconductor 10 in FIG. 4 the method to crate an artificial superlattice of superconducting layers with thickness satisfying the "shape resonance" condition (quantum wells) consists mainly in the alternate deposition of layers 11 and 12 by molecular beam epitaxy or by other equivalent techniques (as for example sputtering, lithography, chemical synthesis, electrochemical deposition) by a fixed number of times in order to realize a three-dimensional metallic heterostructure 10; care should be taken to find materials 11 and 12 with good crystal lattice matching at the interface and to grow flat surfaces at the atomic level.

Industrial Applicability

The metallic heterostructures with high critical temperature will found their applications in the production of electronic devices using superconducting materials, we cite only few examples but the list is larger: SQUID, Josephson junctions, infrared detectors, particle detectors, radiofrequency filters.

What is claimed is:

1. A process for forming a superconductor having an increased critical temperature Tc which comprises the steps of forming a plurality of first portions (3, 11, 21, 31, 41) of size L, measured in a first direction made of a superconducting material, and forming a plurality of second portions (4, 12, 22, 32, 42) of size W, measured in said first direction made of a second material selected from the group consisting of a metal, non-metal or superconductor having a lower critical temperature and having a different electronic structure than that of the superconducting material forming the first portions of said second portions inserted between the first portions to provide separation between said first portions; a portion of said first portions combined with a portion of said second portions have a period $\lambda p$, at least in said first direction; said plurality of second portions (4, 12, 22, 32, 42) are formed with said size W, smaller or of the order of the superconducting Pippard coherence length $\xi_0$ of the superconducting material of the first portions, and the said size L of said plurality of first portions satisfies the shape resonance condition for the electrons at the Fermi level, where the Fermi energy is tuned to the maximum electronic density of states of a superlattice sub-band.

2. A process for forming a superconductor having an increased critical temperature Tc as in claim 1 in which the step of forming said plurality of first portions comprises forming layers of size L made of said superconducting material, and of forming said second portions comprises forming layers of size W made of said second material.

3. A process for forming a superconductor having an increased critical temperature Tc as in claim 1 comprising the steps of forming the first portions as a plurality of parallel atomic planes (2) separated by the distance (h); each plane is formed by the process of claim 1 and the additional step of forming the second portions as planes made of said second material of a thickness of the order of the superconducting Pippard coherence length $\xi_0$ of the superconducting material forming the superconducting stripes (3).

4. A process for forming a superconductor having an increased critical temperature Tc as in claim 1 in which the step of forming said plurality of first portions comprise forming parallel spaced superconducting wires (21) in a three-dimensional lattice, and of forming said second portion forming a matrix (22) made of said second material; said plurality of wires (21) having a cross section equal to said size L, and being separated by said matrix a distance equal to said size W.

5. A process for forming a superconductor having an increased critical temperature Tc as in claim 1 in which the step of forming said plurality of first portions comprises forming nuclei (31) with a substantially spherical form, separated by a distance equal to said size W one from the other by said second portion to form a three-dimensional lattice; said plurality of nuclei (31) have a cross-section equal to said size L, and separated by the said size distance W.

6. A process for forming a superconductor having an increased critical temperature Tc as in claim 1 in which the step of forming said plurality of first portions comprises forming empty spheres (41) separated by second portions by a distance equal to said size W one from the other to form a three-dimensional lattice embedded in a matrix (42) of said second material; said plurality of empty spheres (41) have a cross-section equal to said size L, and being separated by the said size distance W.

* * * * *